United States Patent
Sonoda et al.

(10) Patent No.: US 9,720,225 B2
(45) Date of Patent: Aug. 1, 2017

(54) PROCESSING SYSTEM WITH GALVANO SCANNER CAPABLE OF HIGH SPEED LASER SCANNING

(71) Applicant: FANUC CORPORATION, Minamitsuru-gun, Yamanashi (JP)

(72) Inventors: Naoto Sonoda, Yamanashi (JP); Yukio Toyozawa, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 14/840,226

(22) Filed: Aug. 31, 2015

(65) Prior Publication Data

US 2016/0070097 A1 Mar. 10, 2016

(30) Foreign Application Priority Data

Sep. 8, 2014 (JP) .................................. 2014-182633

(51) Int. Cl.
| | |
|---|---|
| G02B 26/08 | (2006.01) |
| G02B 26/10 | (2006.01) |
| G02B 26/12 | (2006.01) |
| G03F 7/00 | (2006.01) |

(52) U.S. Cl.
CPC ....... *G02B 26/105* (2013.01); *G02B 26/0816* (2013.01); *G03F 7/0037* (2013.01)

(58) Field of Classification Search
CPC G02B 26/105; G02B 26/0816; G02B 26/101; G02B 26/0833; G02B 27/01; G02B 5/30; G02B 27/0101; G02B 27/0149; G03B 21/28; G03B 21/14; G03B 21/2033; G03F 7/0037; H04N 9/3129

USPC .... 359/17, 18, 27, 201.1, 201.2, 202.1, 234, 359/298, 439, 514, 696, 877; 351/212
See application file for complete search history.

(56) References Cited

U.S. PATENT DOCUMENTS

| | | | | |
|---|---|---|---|---|
| 2008/0246943 | A1* | 10/2008 | Kaufman | G01B 11/2518 356/5.01 |
| 2010/0067927 | A1* | 3/2010 | Satoh | G03G 15/043 399/32 |
| 2011/0116054 | A1* | 5/2011 | Wakabayashi | G02B 26/101 353/36 |
| 2013/0083082 | A1* | 4/2013 | Bukesov | C09K 11/7734 345/690 |
| 2013/0301100 | A1* | 11/2013 | Mizoguchi | G02B 26/0816 359/221.2 |
| 2014/0375898 | A1* | 12/2014 | Kurozuka | G02B 26/085 348/760 |
| 2015/0092118 | A1* | 4/2015 | Hada | G03B 21/2033 349/11 |

(Continued)

FOREIGN PATENT DOCUMENTS

| | | | | |
|---|---|---|---|---|
| JP | 2008-170579 A | | 7/2008 | |
| JP | 2013-005312 | * | 1/2013 | ............. G02B 27/01 |

(Continued)

*Primary Examiner* — Scott J Sugarman
*Assistant Examiner* — Mustak Choudhury
(74) *Attorney, Agent, or Firm* — RatnerPrestia

(57) ABSTRACT

A processing system including a laser beam source which generates a laser beam, a galvano scanner which includes a mirror for reflecting the laser beam and a servo motor for rotating the mirror and which emits the laser beam to a workpiece, and an operation control device which controls the operation of the servo motor in accordance with a sinusoidal drive command.

5 Claims, 10 Drawing Sheets

(56) References Cited

U.S. PATENT DOCUMENTS

| | | | | |
|---|---|---|---|---|
| 2015/0168713 A1* | 6/2015 | Nowatzyk | ........... | G02B 26/0816 |
| | | | | 359/201.2 |
| 2015/0185313 A1* | 7/2015 | Zhu | ........... | G01S 17/08 |
| | | | | 356/5.01 |
| 2015/0226949 A1* | 8/2015 | Fukumoto | ........... | G02B 26/101 |
| | | | | 359/199.3 |

FOREIGN PATENT DOCUMENTS

| | | | | |
|---|---|---|---|---|
| JP | 5221735 | | 3/2013 | |
| JP | 5221735-20130315 | * | 3/2013 | ............ G05D 3/00 |

\* cited by examiner

PROCESSING SYSTEM WITH GALVANO SCANNER CAPABLE OF HIGH SPEED LASER SCANNING

BACKGROUND OF THE INVENTION

1. Field of the Invention

The present invention relates to a processing system with a galvano scanner which is capable of high speed laser scanning of a workpiece.

2. Description of the Related Art

In general, a "galvano scanner" is a device which comprises two mirrors which can rotate about two mutually perpendicular rotational axes, and is configured to change scan path of the laser beam on a workpiece by driving rotation of these mirrors using servo motors (galvano motors). Galvano scanners are broadly used in applications for marking workpieces with bar codes or manufacturing serial numbers etc. at a high speed. Galvano scanners are also used for the recently increasingly popular laser sintering type 3D printers and other such stereolithographic apparatuses. Such a stereolithographic apparatus produces a desired 3D shape model by emitting a laser beam to metal powder or a photocurable resin etc. formed into a thin layer so as to sinter or cure the metal powder.

FIG. 11 and FIG. 12 are schematic views which show the routine of a laser sintering operation in a general stereolithographic apparatus in a time series manner. The two figures are plan views of metal powder formed in a layer on a table as seen from above. The galvano scanner first makes the laser beam scan the surface along a path which is shown by the arrows A11 in FIG. 11 so as to sinter the metal powder M. After that, a new thin layer of metal powder M is supplied, and the galvano scanner then makes the laser beam scan the surface along the path which is shown by the arrows A12 in FIG. 11 so as to sinter the metal powder M. In this way, a general laser sintering operation involves a change in the scan direction of the laser beam for sintering the metal powder M each time a new thin layer of metal powder M is supplied. Such a sintering operation of each layer is repeatedly performed to produce a desired 3D shape model.

As will be understood from FIG. 11 and FIG. 12, in the sintering operation of each layer of the metal powder M, the top surface of the model under processing is divided into a plurality of belt-shaped regions R which have predetermined widths (for example, 5 mm). Each of these belt-shaped regions R is scanned by the laser beam. Further, in each of the plurality of belt-shaped regions R, the laser beam repeats back and forth motion at a high speed along the traverse direction of the belt-shaped region R so as to sinter the metal powder M (see arrows A11 in FIG. 11 and arrows A12 in FIG. 12).

In order to sinter a thin layer of metal powder uniformly without irregularities, the laser intensity and laser scan speed are preferably kept constant while the laser beam is moved back and forth. The laser beam is stopped for an instant when the back and forth motion of the laser beam is reversed, the laser control may be designed to turn the laser output off at the time of the reversal of the laser beam so as to prevent uneven sintering (i.e., excessive sintering) due to the reversal. FIG. 13 is a schematic view for explaining the above laser output control. More specifically, FIG. 13 schematically shows the scan path of a laser beam in a general laser sintering operation. In the scan path of the laser beam which is shown by the reference notation P in the figure, the output of the laser beam is temporarily turned off during the periods when the laser beam is stopped. These periods are shown by the broken lines.

FIG. 14 is a graph which shows a temporal change of a scan speed of laser beam in a general laser sintering operation. More specifically, the graph of FIG. 14 is a graph which shows the temporal change of the scan speed of a laser beam while the laser beam makes one back and forth motion in a belt-shaped region R in FIG. 11 or FIG. 12. As shown in FIG. 14, the laser beam is accelerated, moved at a constant speed, and decelerated in the forward direction of the servo motor before being temporarily stopped. Then the laser beam is accelerated, moved at a constant speed, and decelerated in the reverse direction of the servo motor before being stopped again. The drive commands (acceleration/deceleration commands) to the galvano scanner for these periods has stepped forms, but there is always a delay due to the response time of the galvano scanner, and therefore the actual laser beam is accelerated or decelerated with a certain time constant, as shown in FIG. 14. That is, in a conventional galvano scanner, responsiveness of a drive command is limited due to the acceleration ability of the servo motor, and therefore it is difficult to accelerate the scan speed while maintaining the scan precision of the laser beam.

In general, the time constant of on/off control of the laser output is far smaller than the time constant of acceleration/deceleration control of a galvano scanner, and therefore uneven sintering tends to occur in the acceleration/deceleration phase of a galvano scanner. In relation to this, JP2008-170579A proposes a control method which generates a laser output waveform corresponding to the drive command of the galvano scanner. More specifically, the control method of JP2008-170579A delays the timing of emitting the laser beam in accordance with a time constant of the acceleration/deceleration command of the galvano scanner, in an attempt to reduce the uneven sintering. However, the actual operation of the galvano scanner is delayed somewhat from the drive command, and therefore uneven sintering cannot be completely eliminated even if a laser output waveform is generated corresponding to the drive command of the galvano scanner.

A processing system which can accelerate the scan speed of a laser beam by a galvano scanner while maintaining the scan precision is being sought.

SUMMARY OF INVENTION

According to a first aspect of the present invention, there is provided a processing system comprising a laser beam source which generates a laser beam, a galvano scanner which comprises a mirror for reflecting the laser beam and a servo motor for rotating the mirror and which emits the laser beam to a workpiece, and an operation control device which controls the operation of the servo motor in accordance with a sinusoidal drive command.

According to a second aspect of the present invention, there is provided the processing system according to the first aspect, further comprising a detector which detects actual operation of the servo motor, wherein the operation control device comprises an error calculation part which calculates at predetermined periods an error between the drive command and the actual operation of the servo motor detected by the detector, a learning control part which generates a correction amount for correcting the error which is newly calculated by the error calculation part in accordance with the error which has been calculated by the error calculation part at the preceding period, and a servo control part which controls operation of the servo motor based on the error after correction by the correction amount.

According to a third aspect of the present invention, there is provided the processing system according to the second aspect, further comprising a laser control device which controls intensity of the laser beam in accordance with the rotational speed of the servo motor which is detected by the detector.

According to a fourth aspect of the present invention, there is provided the processing system according to the third aspect, wherein the laser control device multiplies the rotational speed of the servo motor detected by the detector with a predetermined coefficient so as to determine the intensity of the laser beam.

According to a fifth aspect of the present invention, there is provided a processing system of the third or fourth aspect, wherein the operation control device and the laser control device are built into the same processor.

These and other objects, features, and advantages of the present invention will become clearer with reference to the detailed description of an illustrative embodiment of the present invention which is shown in the attached drawings.

DETAILED DESCRIPTION OF EMBODIMENTS

Figure 1:
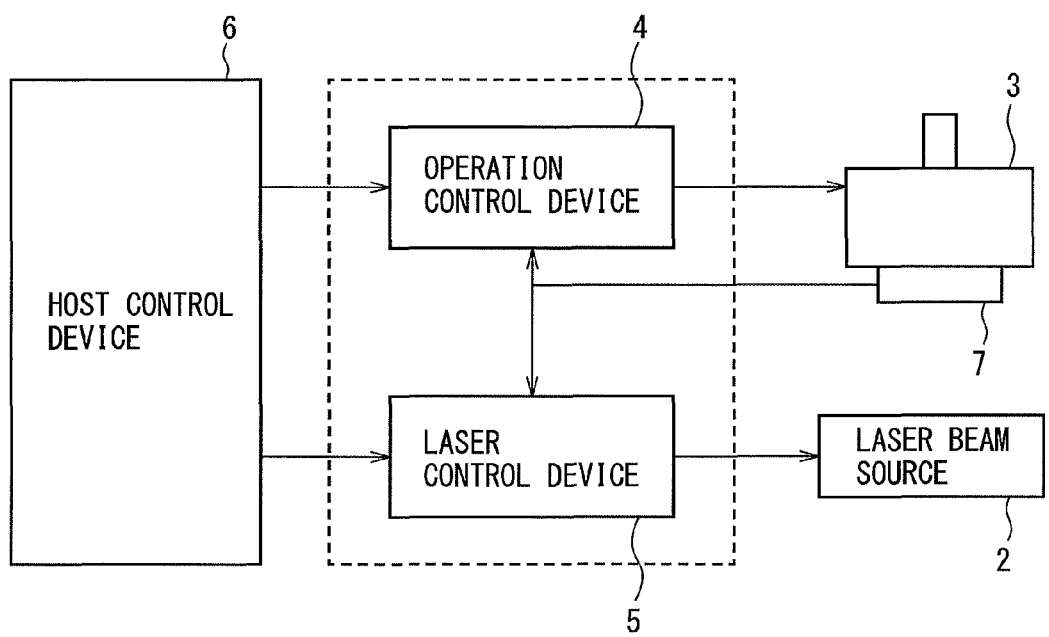
FIG. 1 is a block diagram which shows the configuration of a processing system of one embodiment of the present invention.

Below, an embodiment of the present invention will be explained in detail with reference to the drawings. In the drawings, similar component elements are assigned similar reference notations. Note that the following explanation does not limit the technical scope of the inventions which are described in the claims or the meaning of terms etc.

Referring to FIG. 1 to FIG. 10, a processing system of one embodiment of the present invention will be explained. The processing system of the present embodiment is a laser sintering type stereolithographic apparatus which repeatedly performs a sintering operation which includes irradiating a layered object of a metal powder or photocurable resin with a laser beam so as to create a desired 3D shape model. FIG. 1 is a block diagram which shows the configuration of an illustrative processing system 1 of the present embodiment. As shown in FIG. 1, the processing system 1 of the present example comprises a laser beam source 2 which generates a laser beam, a galvano scanner 3 which emits the laser beam generated by the laser beam source 2 tot a workpiece, an operation control device 4 which controls the operation of the galvano scanner 3, a laser control device 5 which controls the operation of the laser beam source 2, and a host control device 6 which transmits control signals to the operation control device 4 and laser control device 5. These component elements will be explained below in order.

Figure 2:
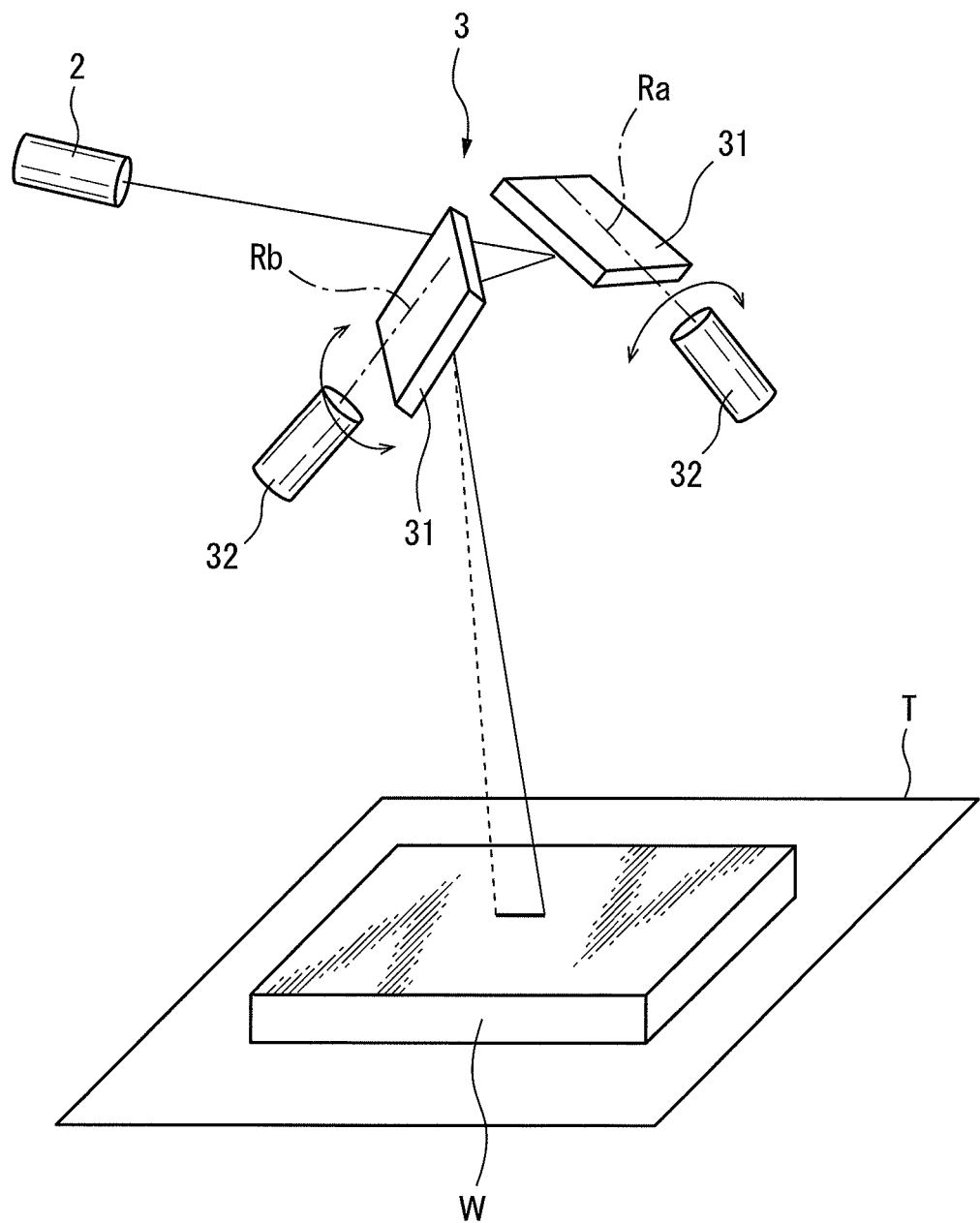
FIG. 2 is a perspective view which schematically shows a laser beam source and galvano scanner in the processing system of FIG. 1.

FIG. 2 is a perspective view which schematically shows a laser beam source 2 and galvano scanner 3 in the processing system of FIG. 1. As shown in FIG. 2, the laser beam source 2 and galvano scanner 3 are located above a table T on which the workpiece is placed. The "workpiece W" which is referred to here is a layered object of a metal powder or photocurable resin which is sintered by laser irradiation. Such a layered object is repeatedly supplied with a new thin layer by a not shown mechanical system. However, the layered object may also be supplied with a new thin layer by the user by hand.

As shown in FIG. 2, the laser beam source 2 is one of various laser oscillators which comprises a laser medium, optical resonator, excitation source, etc. and is configured to emit a laser beam toward the galvano scanner 3. Further, the galvano scanner 3 comprises a plurality of mirrors which successively reflect the laser beam emitted from the laser beam source 2, and a plurality of servo motors which rotate the plurality of mirrors about predetermined rotational axes. More specifically, the galvano scanner 3 of the present example comprises two mirrors 31, 31 which can rotate about two mutually perpendicular rotational axes Ra, Rb and two servo motors 32, 32 which rotate these mirrors 31, 31. However, the number, arrangement, etc. of the plurality of mirrors and the plurality of servo motors in the galvano scanner 3 are not limited to only the example in the figures.

Figure 11:
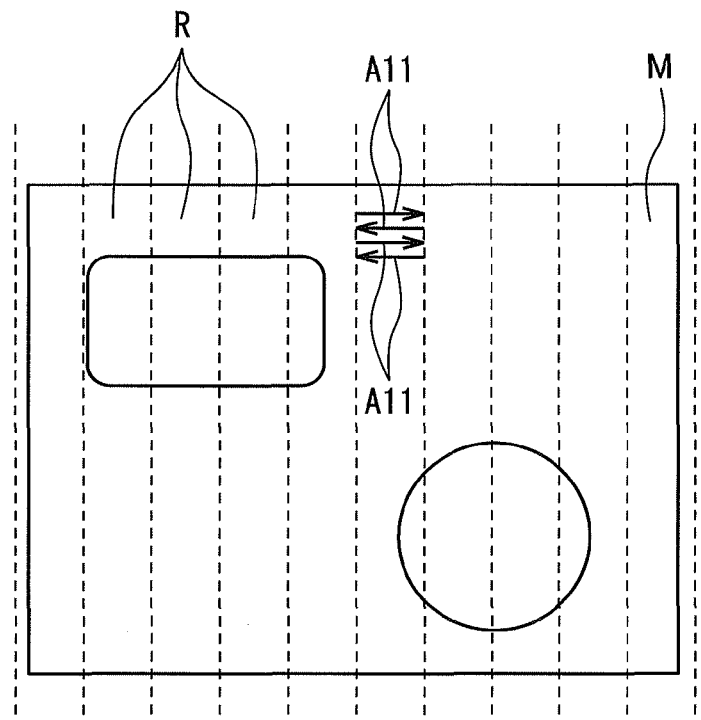
FIG. 11 is a first schematic view which shows the routine of a laser sintering operation in a general stereolithographic apparatus in a time series manner.
Figure 12:
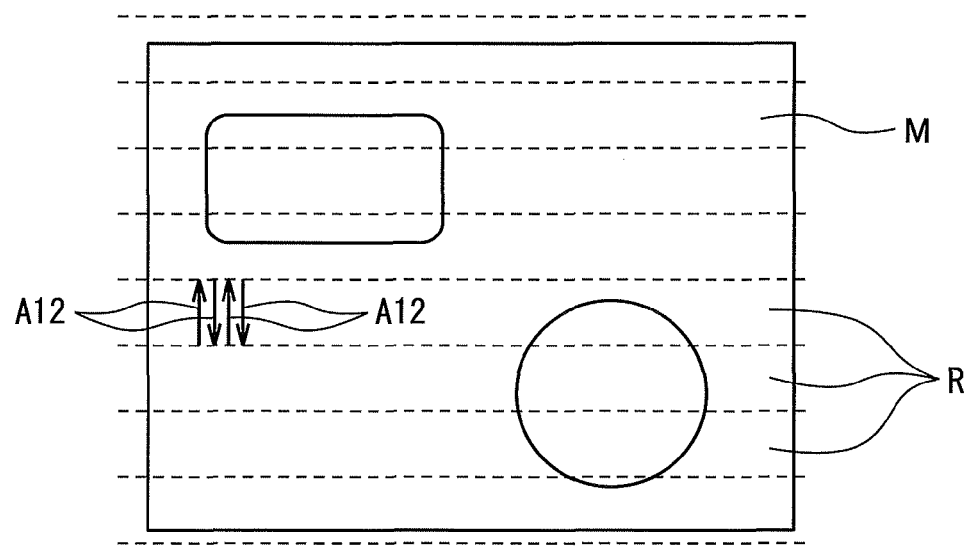
FIG. 12 is a second schematic view which shows the routine of a laser sintering operation in a general stereolithographic apparatus in a time series manner.
Figure 13:
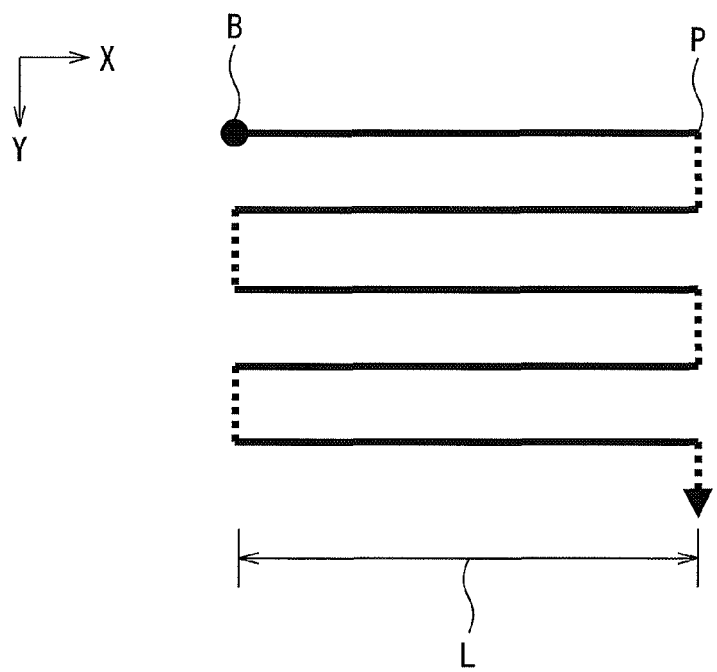
FIG. 13 is a schematic view for explaining laser output control in a general laser sintering operation.

As shown in FIG. 2, the laser beam emitted from the laser beam source 2 is successively reflected by the two mirrors 31, 31 to reach the workpiece W on the table T. Further, while the two mirrors 31, 31 of the galvano scanner 3 are rotated by the two servo motors 32, 32 respectively, the incident angles of the laser beam entering these mirrors 31, 31 are continuously changed. As a result, the laser beam which reaches the workpiece W scans the top surface of the workpiece W along a predetermined scan path. In so doing, the laser beam which reaches the workpiece W repeats back and forth motion along a stroke of a total length of 5 mm or so, in the same way as the example which is shown in FIG. 11 and FIG. 12. That is, the scan path of the laser beam on the top surface of the workpiece W is similar to the scan path P of the laser beam which is shown in FIG. 13. The sintering operation at each layer of the layered object is performed in such a way.

As will be understood from FIG. 13, the scan path P of the laser beam by the galvano scanner 3 comprises an X-direction component which is parallel to the traverse direction of the above-mentioned belt-shaped region R (see FIG. 11 and FIG. 12) and a Y-direction component which is parallel to the longitudinal direction of the belt-shaped region R. As explained above, the total length L in the X-direction of the scan path of the laser beam is for example 5 mm. Further, in a sintering operation of one thin layer of the workpiece W, the rotational motion of one servo motor 32 of the galvano scanner 3 causes linear motion of the laser beam along the X-direction (that is, back and forth motion), while the rotational motion of the other servo motor 32 causes linear motion of the laser beam along the Y-direction. However, as will be understood from FIG. 11 and FIG. 12, each time a new thin layer is supplied to the workpiece W, the belt-shaped regions R are rotated by 90°, and therefore in the sintering operation of the new thin layer, the rotational motion of one servo motor 32 causes linear motion of the laser beam along the Y-direction, while the rotational motion of the other servo motor 32 causes linear motion of the laser beam along the X-direction (that is, back and forth motion). Note that, the position and speed of the laser beam on the scan path P on the workpiece W, that is, the rotational positions and rotational speeds of the servo motors 32, 32 which drive the mirrors 31, 31, are controlled by the above operation control device 4. Further, the intensity, on/off switching, etc. of the laser beam emitted from the laser beam source 2 are controlled by the above laser control device 5.

Referring again to FIG. 1, the operation control device 4 of the present example has the function of controlling the operation of one servo motor 32 of the galvano scanner 3 in accordance with a drive command which is received from the host control device 6. Note that, FIG. 1 shows only one operation control device 4, but the processing system 1 of the present embodiment has the same number of operation control devices 4 as the servo motors 32. Further, the laser control device 5 of the present example has the function of controlling the intensity of the laser beam of the laser beam source 2 in accordance with a control signal which is received from the host control device 6. In particular, the processing system 1 of the present example further comprises detectors 7 for detecting actual operations of the servo motors 32. The operation control device 4 and laser control device 5 perform feedback control based on information which is acquired from the detectors 7. This point will be explained further later. The detectors 7 are, for example, rotary encoders which are attached to the servo motors 32.

Figure 3:
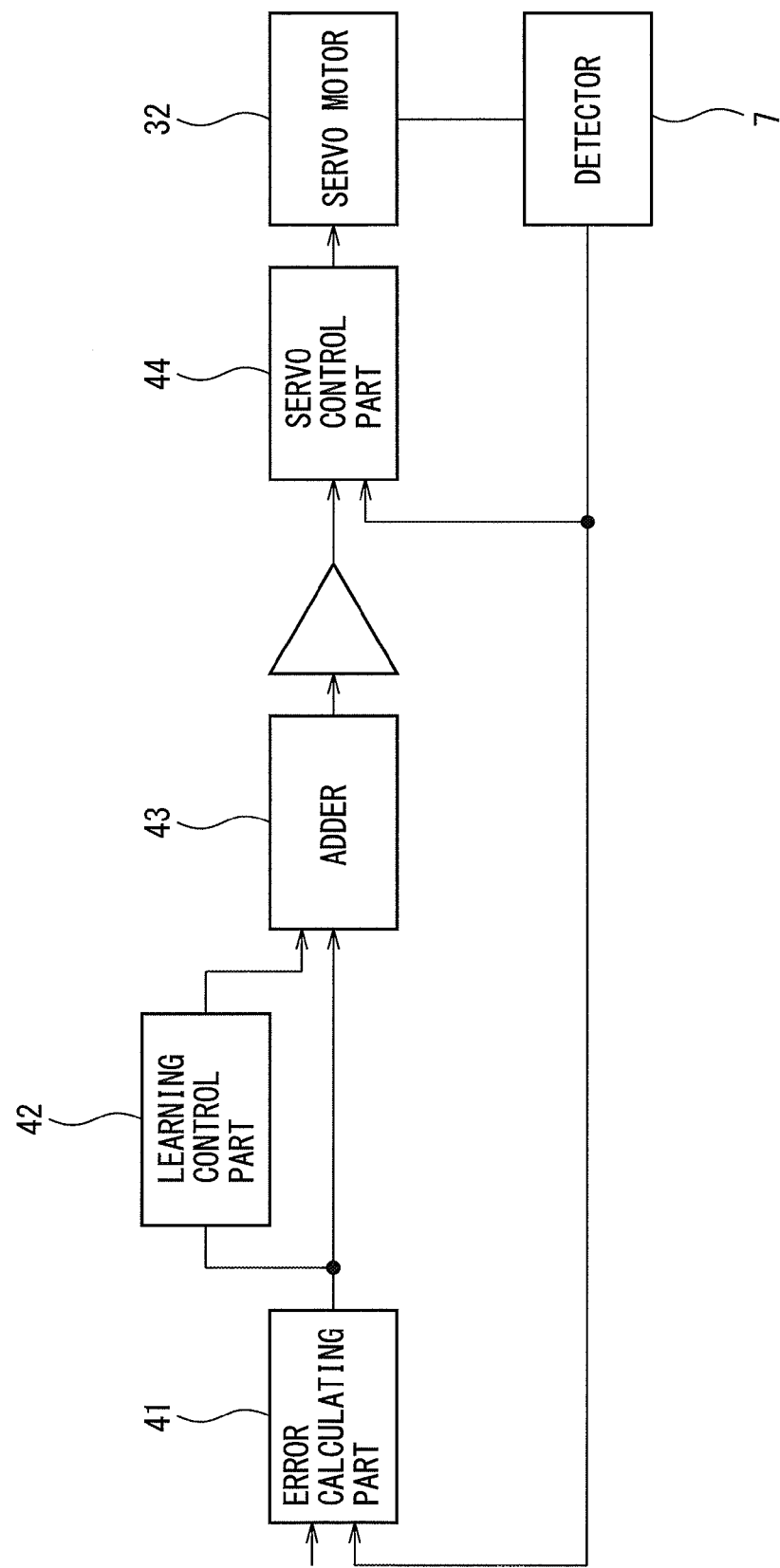
FIG. 3 is a block diagram which shows the configuration of an operation control device in the processing system of FIG. 1.

FIG. 3 is a block diagram which shows the configuration of the operation control device 4 in the processing system 1 of FIG. 1. As shown in FIG. 3, the operation control device 4 of the present example comprises an error calculation part 41, learning control part 42, adder 43, and servo control part 44. The error calculation part 41 calculates the control error between the drive command which is acquired from the host control device 6 and the feedback information which is acquired from the detector 7 at predetermined sampling periods. Further, the learning control part 42 generates a correction amount which minimizes the error calculated by the error calculation part 41. The specific configuration of the learning control part 42 will be explained later. Further, the adder 43 adds the error calculated by the error calculation part 41 with the correction amount generated by the learning control part 42. The result of addition by the adder 43 is amplified with a predetermined gain (position gain), then is input to the servo control part 44. Further, the control error after correction by the above-mentioned correction amount is used as the basis to control the operation of the servo motor 32. In particular, the servo control part 44 of the present example controls the rotational speed, current value, etc. of the servo motor 32 in accordance with the general PID (Proportional-Integral-Derivative) control system.

Figure 4:
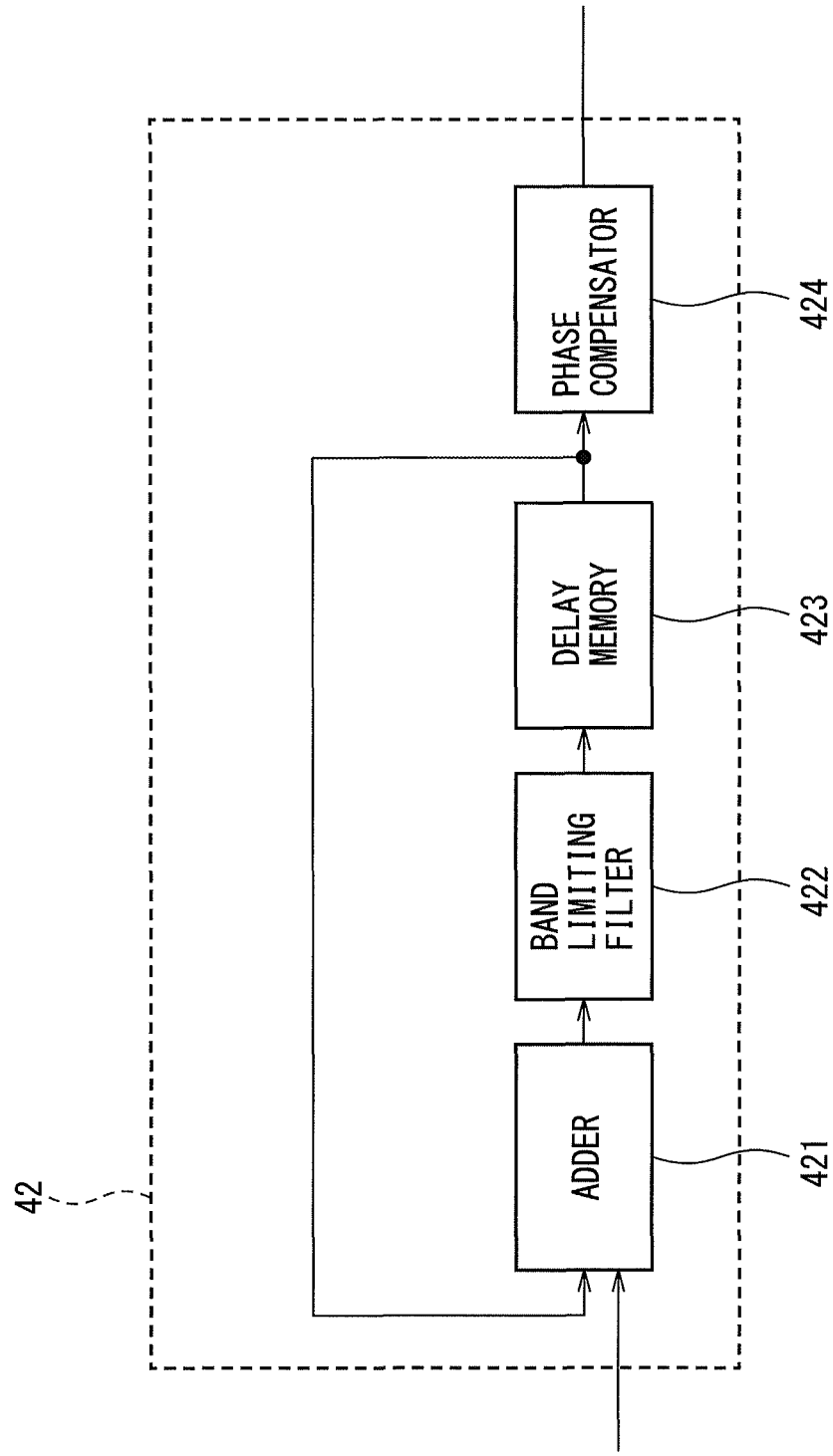
FIG. 4 is a block diagram which shows the configuration of a learning control part in the operation control device of FIG. 3.

FIG. 4 is a block diagram which shows the configuration of the learning control part 42 in the operation control device 4 of FIG. 3. As shown in FIG. 4, the learning control part 42 of the present example comprises an adder 421, band limiting filter 422, delay memory 423, and phase compensator 424. The adder 421 adds the error which was input from the above error calculation part 41 and the correction amount of the preceding period which is stored in the delay memory 423. Further, the band limiting filter 422 is a general low pass filter which cuts off the high frequency region in the results of addition by the adder 421. Further, the delay memory 423 stores the output value from the band limiting filter 422 for a time equal to one period. Further, the phase compensator 424 performs phase compensation on the output value from the band limiting filter 422. Further, the output value from the phase compensator 424 is input to the above adder 43 as a correction amount for correcting the control error which is newly calculated by the error calculation part 41.

In this way, the learning control part 42 of the present example generates a correction amount for correcting the newly calculated control error based on the control error of the preceding period which is stored in the delay memory 423. Referring again to FIG. 3, the adder 43 adds the control error which was calculated by the error calculation part 41 and the correction amount was generated by the learning control part 42, so as to correct the control error. Further, the servo control part 44 controls the operation of the servo motor 32 based on the error after correction by the above correction amount. Such a control method is generally called "learning control" (or "repeat control"). By repeatedly performing learning control, it is possible to make the control error calculated by the error calculation part 41 to converge toward zero. The learning control part 42 in the operation control device 4 of the processing system 1 of the present embodiment is not an essential component element, and therefore may be omitted. If the learning control part 42 is omitted, the servo control part 44 of the operation control device 4 performs usual feedback control based on the control error which is calculated by the error calculation part 41.

Figure 5:
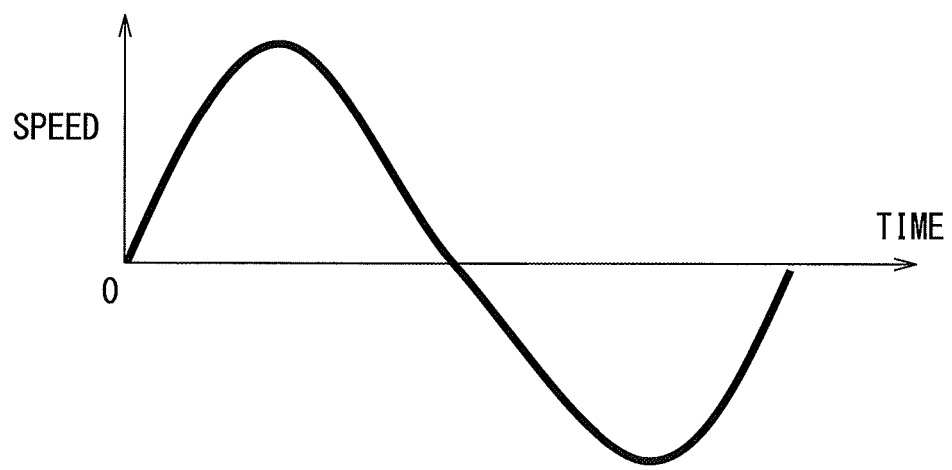
FIG. 5 is a graph which shows one example of a speed command generated by the host control device in FIG. 1.

Referring again to FIG. 1, the host control device 6 has the function of generating a drive command for the galvano scanner 3 and intensity command for the laser beam source 2 and other various control signals and transmitting these commands to the operation control device 4 and laser control device 5. In particular, the the host control device 6 of the present example generates as a drive command for moving the laser beam back and forth along the X-direction in FIG. 13, a sinusoidal speed command to the servo motor 32. FIG. 5 is a graph which shows one example of a speed command generated by the host control device 6. As shown in FIG. 5, the temporal change of the speed command according to this example is expressed by a sinusoidal curve. The origin O of the coordinate system in the figure corresponds to the starting point B of the scan path of FIG. 13. Further, in the present example, while the servo motor 32 is rotating in the forward direction (that is, while the rotational speed is a positive value), the laser beam moves along the X-direction in FIG. 13, while while the servo motor 32 is rotating in the reverse direction (that is, while the rotational speed is a negative value), the laser beam moves in the opposite direction of the X-direction. The sinusoidal drive command generated by the host control device 6 is transmitted to the operation control device 4. Further, the operation control device 4 controls the operation of the servo motor 32 in accordance with the sinusoidal drive command which is acquired from the host control device 6.

Figure 14:
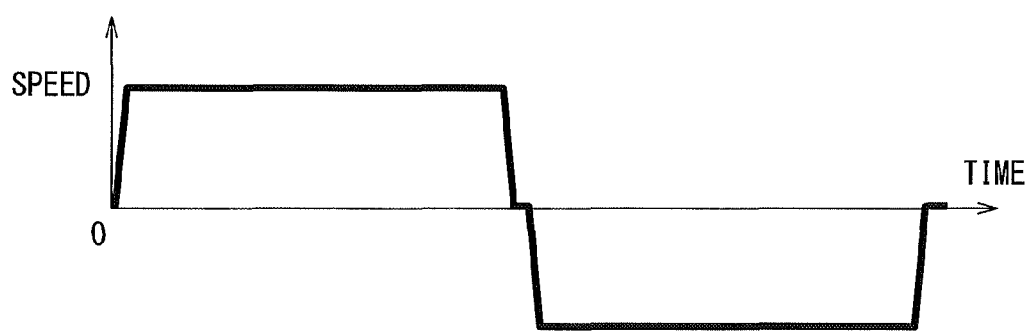
FIG. 14 is a graph which shows a temporal change of a scan speed of laser beam in a general laser sintering operation.

In this way, according to the processing system 1 of the present example, the operation of the servo motor 32 is controlled in accordance with a sinusoidal drive command (see FIG. 5), and therefore it is possible to smooth the acceleration/deceleration of the servo motor 32 for moving the laser beam move back and forth over the top surface of the workpiece W. As will be understood from FIG. 5 and FIG. 14, according to the processing system 1 of the present example, the maximum speed of the servo motor 32 for moving the laser beam back and forth is relatively large, and therefore it is possible to shorten the required time for the laser sintering process. In the processing system 1 of the present example, the learning control part 42 of the operation control device 4 can perform learning control for making the control error between the drive command of the servo motor 32 and the feedback information converge toward zero, and therefore it is possible to ensure that the operation of the servo motor 32 follows the drive command with a high precision even if the servo motor 32 is accelerated to a high speed. As a result, it is possible to realize high speed and high precision modeling by laser sintering.

Referring again to FIG. 1, the laser control device 5 is configured to control the intensity of the laser beam according to the actual operation of the servo motor 32 which is detected by the detector 7. More specifically, the laser control device 5 of the present example multiplies the rotational speed of the servo motor 32 which is acquired from the detector 7 with a predetermined output coefficient so as to determine the intensity of the laser beam. As a result, for example, the intensity of the laser beam is increased when the scan speed of the laser beam is increased, and the intensity of the laser beam is decreased when the scan speed of the laser beam is decreased. Further, when the scan speed of the laser beam reaches zero (that is, if the laser beam is stopped), the intensity of the laser beam also reaches zero. By controlling the intensity of the laser beam in accordance with the actual scan speed of the laser beam in this way, it is possible to prevent uneven sintering which may occur during back and forth motion of the laser beam, even when the above sinusoidal drive command is adopted. The operation control device 4 and laser control device 5 of the processing system 1 of the present example are preferably built into the same processor. This ensures that control of the servo motors 32 and laser beam source 2 are performed by the same processor, and therefore it is possible to minimize the response time when reflecting feedback information of the servo motor 32 back to the intensity of the laser beam.

Figure 6:
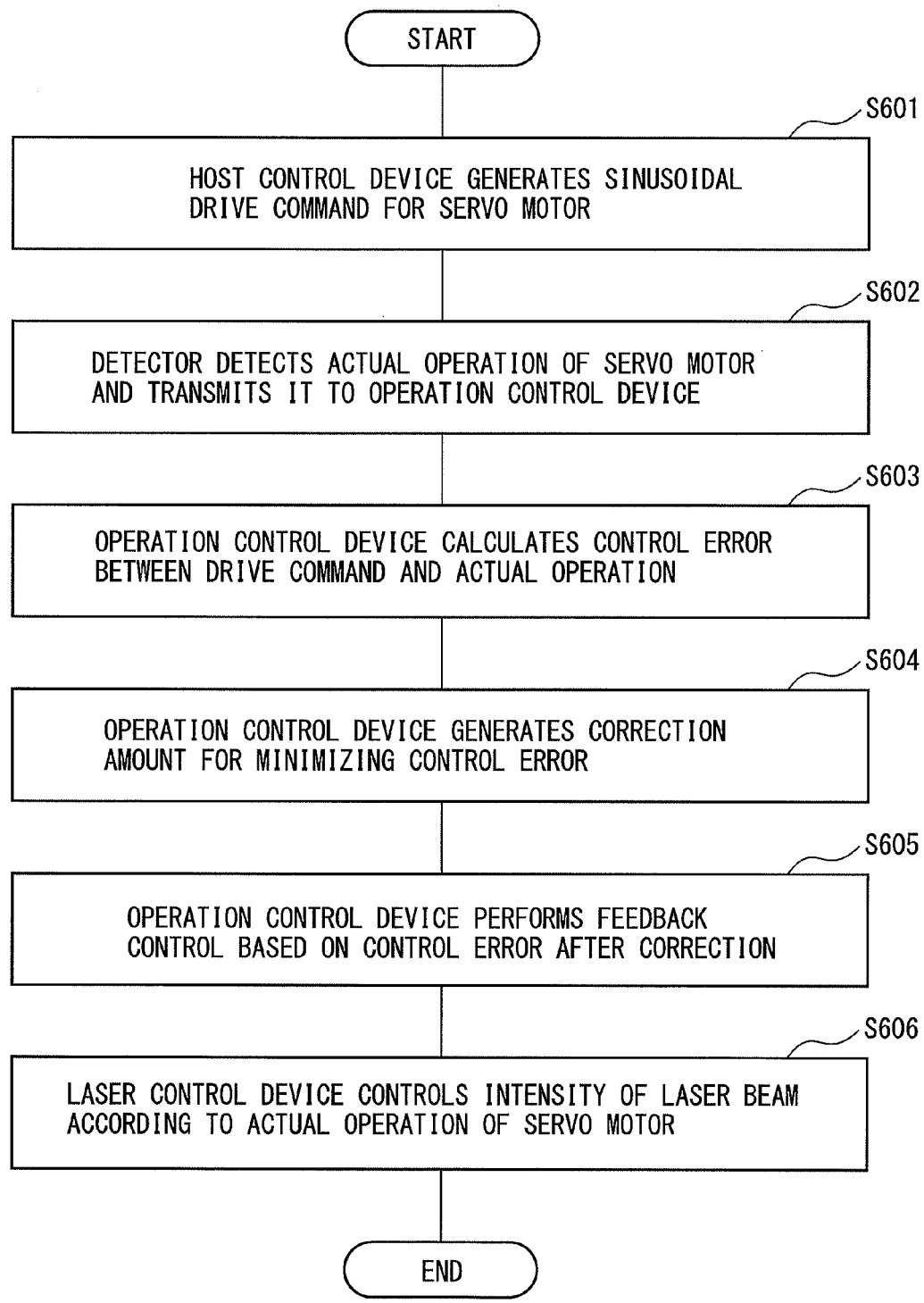
FIG. 6 is a flowchart which shows the routine of a control method of a laser beam source and galvano scanner in a processing system of the present embodiment.

Next, a control method of the laser beam source 2 and galvano scanner 3 in the processing system 1 of the present embodiment will be explained with reference to a flowchart. FIG. 6 is a flowchart which shows the routine of an illustrative control method of the laser beam source 2 and galvano scanner 3. As shown in FIG. 6, first, at step S601, the host control device 6 generates a sinusoidal drive command for the servo motor 32 of the galvano scanner 3 (see FIG. 5). The drive command generated at step S601 is transmitted to the error calculation part 41 of the operation control device 4. Next, at step S602, the detector 7 detects the actual operation of the servo motor 32 and transmits it to the error calculation part 41 of the operation control device 4.

Next, at step S603, the error calculation part 41 of the operation control device 4 calculates the control error between the drive command which is acquired from the host control device 6 and the actual operation of the servo motor which is acquired from the detector 7. The error calculated at step S603 is transmitted to the learning control part 42 and adder 43. Next, at step S604, the learning control part 42 of the operation control device 4 generates a correction amount for minimizing the control error obtained from the error calculation part 41. The method of generating such a correction amount is as explained above. Further, a method of generating a suitable correction amount for correcting the control error of the servo motor is also disclosed in JP5221735B. Next, at step S605, the servo control part 44 of the operation control device 4 performs feedback control of the servo motor 32 based on the control error after correction by the correction amount which is generated at step S604. Next, at step S606, the laser control device 5 controls the intensity of the laser beam in accordance with the actual operation of the servo motor which is detected by the detector 7. More specifically, the laser control device 5 multiples the actual rotational speed with a predetermined output coefficient to determine the intensity of the laser beam.

Figure 7:
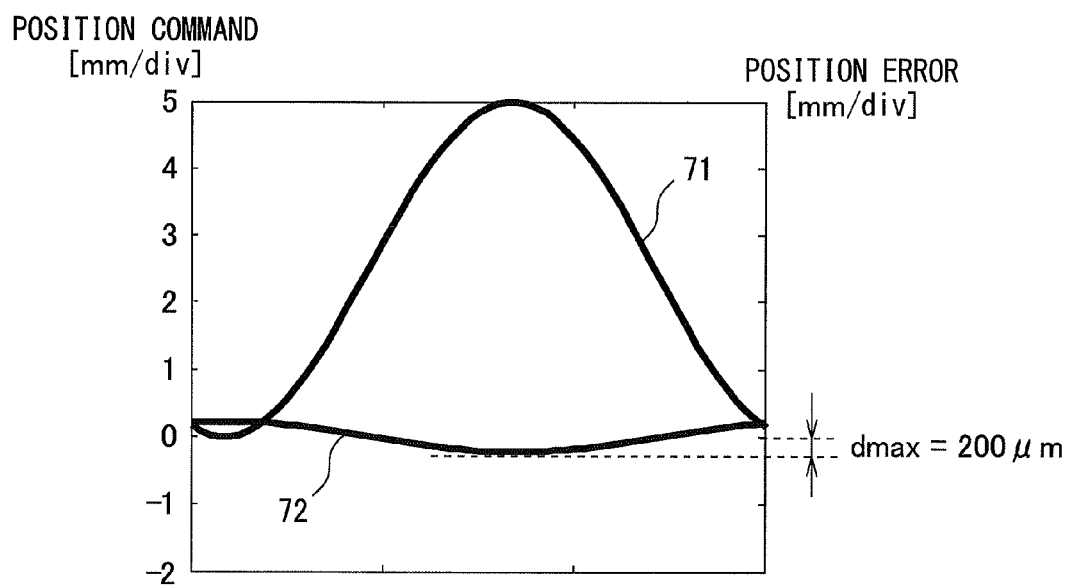
FIG. 7 is a first graph which shows the results of numerical simulation of control error of a galvano scanner in a processing system of the present embodiment.
Figure 8:
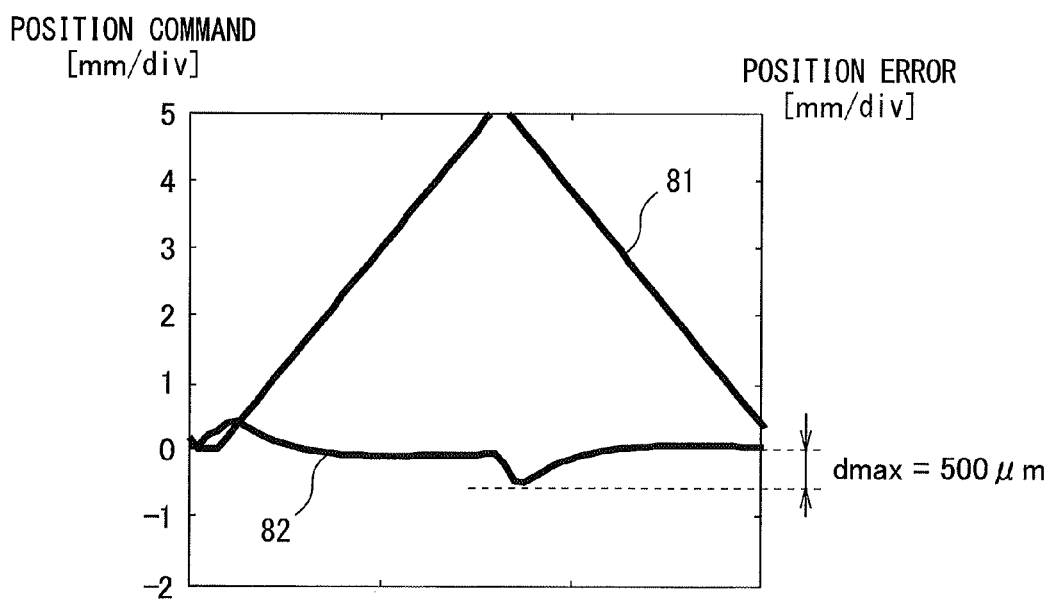
FIG. 8 is a graph corresponding to FIG. 7 which shows the results of simulation of control error of a galvano scanner in a conventional processing system.

Next, the results of numerical simulation of the control error in the processing system 1 of the present embodiment will be explained. FIG. 7 is a graph which shows the results of numerical simulation of the position error based on the above-mentioned sinusoidal speed command (see FIG. 5) together with the position command which corresponds to that speed command. On the other hand, FIG. 8 is a graph which shows the results of numerical simulation of the position error based on a conventional step-like speed command (see FIG. 14) together with the position command which corresponds to that speed command. In the numerical simulations of FIG. 7 and FIG. 8, the position error is calculated under the condition where the laser beam moves back and forth over a stroke of a total length of 5 mm in 15 msec. The total lengths of the abscissas (time axes) of FIG. 7 and FIG. 8 correspond to time periods of 15 msec. The above condition is similarly employed in the numerical simulations of the later explained FIG. 9 and FIG. 10. In the numerical simulations of FIG. 7 and FIG. 8, the learning control part 42 is not performed by learning control of the servo motor 32.

Referring to FIG. 7 and FIG. 8, the numerical values of the graphs 71, 81 of the position commands are expressed by the ordinates on the left sides (1 mm/div), while the numerical values of the graphs 72, 82 of the position errors are expressed by the ordinates on the right sides (1 mm/div). The numerical values (mm) of the position commands expressed by the ordinate on the left sides correspond to the displacement in the X-direction from the starting point B of back and forth motion of the laser beam (see FIG. 13). As will be understood from FIG. 7 and FIG. 8, when a conventional step-like speed command is employed, the maximum value $d_{max}$ of the position error is 500 µm (see FIG. 8). However, when the above-mentioned sinusoidal speed command is employed, the maximum value $d_{max}$ of the position error decreases to 200 µm (see FIG. 7). It is learned that by controlling the operation of the servo motor 32 in accordance with a sinusoidal drive command in this way, it is possible to considerably reduce the control error of the servo motor 32.

Figure 9:
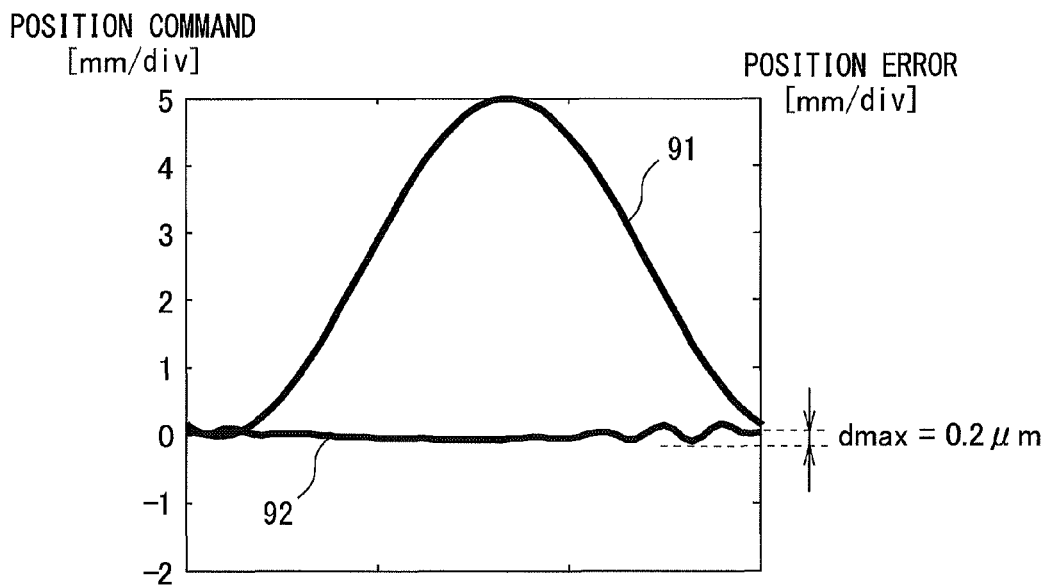
FIG. 9 is a second graph which shows the results of numerical simulation of control error of a galvano scanner in a processing system of the present embodiment.
Figure 10:
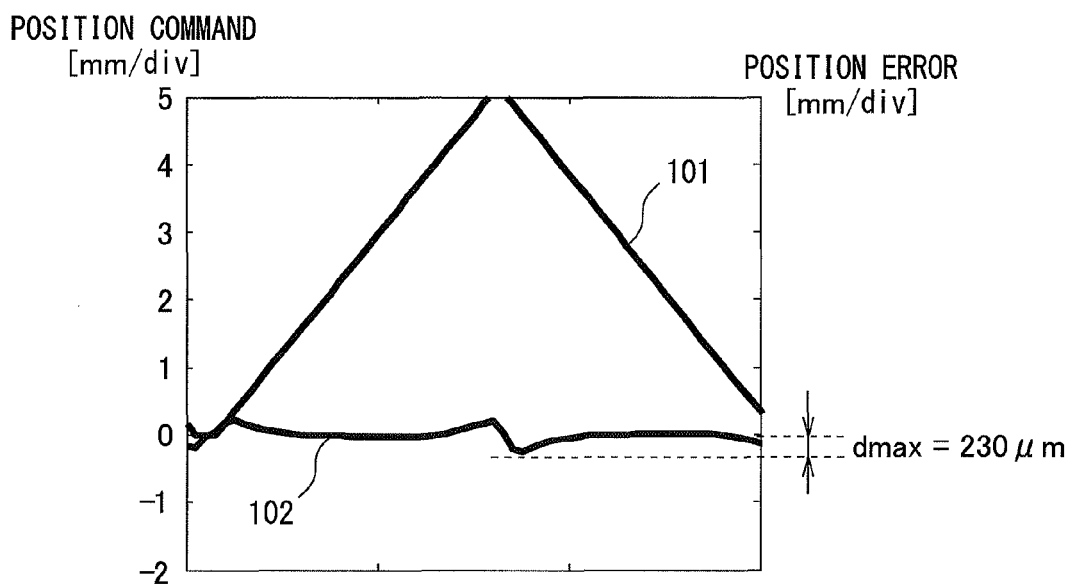
FIG. 10 is a graph corresponding to FIG. 9 which shows the results of simulation of control error of a galvano scanner in a conventional processing system.

Next, FIG. 9 and FIG. 10 are graphs respectively correcting to FIG. 7 and FIG. 8 and showing the results of numerical simulation of the control error. In the numerical simulation of FIG. 9 and FIG. 10, learning control of the servo motor 32 is performed by the learning control part 42. The other conditions are similar to the above-mentioned numerical simulations of FIG. 7 and FIG. 8. Referring to each of FIG. 9 and FIG. 10, in the same way as FIG. 7 and FIG. 8, the numerical values of the graphs 91, 101 of the position commands are expressed by the ordinates on the left sides (1 mm/div), while the numerical values of the graphs 92, 102 of the position errors are expressed by the ordinates on the right sides. However, it is necessary to note that the size of one division of the ordinate on the right side in FIG. 9 is 1 μm while the size of each division at the ordinate on the right side in FIG. 10 is 1 mm in the same way as FIG. 7 and FIG. 8.

As will be understood from FIG. 9 and FIG. 10, when a conventional step-like speed command is employed, the maximum value $d_{max}$ of the position error is 230 μm (see FIG. 10). However, when the above-mentioned sinusoidal speed command is employed, the maximum value $d_{max}$ of the position error decreases to 0.2 μm (see FIG. 9). It is learned that by performing feedback control after correcting the control error by a correction amount which is generated by the learning control part 42, in addition to employing the above sinusoidal drive command, it is possible to further reduce the position error of the servo motor 32.

In the above way, according to the processing system 1 of the present embodiment, the operation of the servo motor 32 of the galvano scanner 3 is controlled in accordance with a sinusoidal drive command (see FIG. 5), and therefore it is possible to smooth the acceleration/deceleration of the servo motor 32 for moving the laser beam move back and forth. Therefore, according to the processing system 1 of the present embodiment, it is possible to accelerate the scan speed of the laser beam while maintaining the scan precision of the laser beam, and as a result it is possible to improve the productivity in modeling by laser sintering. Note that, the block diagrams of FIG. 3 and FIG. 4 and the flowchart of FIG. 6 etc. show only the control method of one servo motor 32 of the galvano scanner 3, but the other servo motor 32 is similarly controlled in a similar manner.

Effect of Invention

According to the first aspect of the present invention, the operation of the servo motor of the galvano scanner is controlled by a sinusoidal drive command, and therefore it is possible to smooth the acceleration/deceleration of the servo motor for moving the laser beam back and forth. Therefore, according to the first aspect, it is possible to accelerate the scan speed of the laser beam while maintaining the scan precision of the laser beam, and as a result it is possible to improve the productivity of modeling by laser sintering.

According to the second aspect of the present invention, the control error of the servo motor is reduced by learning control, and therefore it is possible to reduce uneven sintering due to error which occurs when the laser beam is stopped.

According to the third aspect of the present invention, the intensity of the laser beam is controlled in accordance with the actual operation of the galvano scanner, and therefore it is possible to reduce uneven sintering which occurs while the laser beam is moving back and forth.

According to the fourth aspect of the present invention, it is possible to simplify the control mechanism of the laser beam source, and thus possible to manufacture the laser control device and processing system in an inexpensive and easy manner.

According to the fifth aspect of the present invention, control of the servo motor and laser beam source is performed by the same processor, and therefore it is possible to minimize the response time for reflecting the feedback information of the servo motor to the intensity of the laser beam.

The present invention is not limited to only the above embodiments and can be modified in various ways within the scope described in the claims. For example, the processing system 1 of the above embodiment is a stereolithographic apparatus which forms a three-dimensional shape by repeating a laser sintering operation, but the processing system 1 of the present invention may be any processing machine that can move laser beam back and forth repeatedly in accordance with operation of a galvano scanner 3. Further, the structures and functions etc. of the apparatuses of the processing system 1 which is described in the above embodiments are only examples. Various structures and functions etc. can be employed for achieving the effects of the present invention.

The invention claimed is:

1. A processing system comprising: a laser beam source which generates a laser beam, a galvano scanner which comprises a mirror for reflecting said laser beam and a servo motor for rotating said mirror and which emits said laser beam to a workpiece, an operation control device which controls the operation of said servo motor in accordance with a sinusoidal drive command, a detector which detects an actual operation of said servo motor exclusive of the laser beam output, by detecting a position of a rotary encoder attached to the servo motor, an error calculation part which calculates an error between said drive command and the actual operation of said servo motor detected by said detector, a learning control part which generates a correction amount for correcting said error based on the error and a previous error calculated by the error calculation part, and a servo control part which controls operation of said servo motor based on said error after correction by said correction amount.

2. The processing system according to claim 1, further comprising
 a detector which detects actual operation of said servo motor, wherein
 said operation control device comprises:
 an error calculation part which calculates at a plurality of predetermined periods an error between said drive command and the actual operation of said servo motor detected by said detector,
 a learning control part which generates a correction amount for correcting said error which is newly calculated by said error calculation part in accordance with said error which has been calculated by said error calculation part at a preceding period, and
 a servo control part which controls operation of said servo motor based on said error after correction by said correction amount.

3. The processing system according to claim 2, further comprising a laser control device which controls intensity of said laser beam in accordance with a rotational speed of said servo motor which is detected by said detector.

4. The processing system according to claim 3, wherein said laser control device multiplies the rotational speed of said servo motor detected by said detector with a predetermined coefficient so as to determine the intensity of said laser beam.

5. The processing system according to claim 3, wherein said operation control device and said laser control device are built into the same processor.

* * * * *